(12) United States Patent
Cheng et al.

(10) Patent No.: US 8,324,074 B2
(45) Date of Patent: Dec. 4, 2012

(54) STRUCTURE AND METHOD TO MINIMIZE REGROWTH AND WORK FUNCTION SHIFT IN HIGH-K GATE STACKS

(75) Inventors: Kangguo Cheng, Guilderland, NY (US); Bruce Doris, Brewster, NY (US); Pranita Kulkarni, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 475 days.

(21) Appl. No.: 12/557,934

(22) Filed: Sep. 11, 2009

(65) Prior Publication Data

US 2011/0062546 A1 Mar. 17, 2011

(51) Int. Cl.
H01L 21/76 (2006.01)
H01L 29/06 (2006.01)
H01L 21/762 (2006.01)

(52) U.S. Cl. ............. 438/424; 257/E21.54; 257/E29.02
(58) Field of Classification Search ................. 438/424; 257/E21.546, E29.02
See application file for complete search history.

(56) References Cited

U.S. PATENT DOCUMENTS

| | | | |
|---|---|---|---|
| 7,749,835 B2 * | 7/2010 | Li et al. | 438/243 |
| 7,772,647 B2 * | 8/2010 | Anderson et al. | 257/348 |

\* cited by examiner

*Primary Examiner* — David S Blum
(74) *Attorney, Agent, or Firm* — Connolly Bove Lodge & Hutz LLP; Louis J. Percello, Esq.

(57) ABSTRACT

The present invention provides a semiconductor structure comprising high-k material portions that are self-aligned with respect to the active areas in the semiconductor substrate and a method of fabricating the same. The high-k material is protected from oxidation during the fabrication of the semiconductor structure and regrowth of the high-k material and shifting of the high-k material work function is prevented.

10 Claims, 7 Drawing Sheets

STRUCTURE AND METHOD TO MINIMIZE REGROWTH AND WORK FUNCTION SHIFT IN HIGH-K GATE STACKS

FIELD OF THE INVENTION

The present invention generally relates to semiconductor devices, and particularly to semiconductor devices comprising high-k dielectric gate portions, and methods of manufacturing the same.

BACKGROUND OF THE INVENTION

Materials with a high dielectric constant, referred to herein as high-k materials or as high-k gate materials, are utilized in high-k gate complementary metal oxide semiconductor (CMOS) technology. In CMOS devices having a silicon channel, a conductive material having a work function of about 4.0 eV is necessary for n-type metal oxide semiconductor field effect transistors (NMOSFETs) and another conductive material having a work function of about 5.0 eV is necessary for p-type metal oxide semiconductor field effect transistors (PMOSFETs). In conventional high-k gate CMOS fabrication, the high-k material of the gate stack, specifically hafnium oxide dielectrics, are prone to re-growth. Further, the workfunction of the high-k gate material may shift if the high-k material is exposed to oxygen during processing or comes into contact with oxygen-containing materials, such as silicon dioxide, $SiO_2$. Additionally, the gate stack can grow thicker as a result of the thermal budget and presence or contact of the hafnium with the $SiO_2$.

In conventional CMOS devices employing polysilicon gate materials, a heavily p-doped polysilicon gate and a heavily n-doped polysilicon gate are employed to address the needs. In CMOS devices employing high-k gate dielectric materials, suitable materials satisfying the work function requirements are needed. So far, identification of materials for a dual work function metal gate electrode system has presented some challenges. Moreover, finding high k gate stack materials suitable for gate first applications where the dielectric materials are subjected to high thermal budgets is a challenge.

The current state of the art in fabrication of high k gate stack transistors involves forming shallow trench isolation to separate nFET regions from pFET regions, depositing high k, metals, and poly silicon. The gate stack materials are then patterned using photolithographic techniques and reactive ion etching to form the gate electrode. Thus, in instances where the gate electrode is shared between nFET regions and pFET regions, the gate electrode will also be in contact with the $SiO_2$ material from the shallow trench isolation. It may be possible to remove the high k materials from being in contact with the shallow trench isolation regions by a costly photo lithographic and etching technique. However, this technique would suffer the overlay and critical dimension variations inherent in photolithographic techniques.

In view of the above, there exists a need for reliable forming a semiconductor structure wherein the high-k material layer is precisely aligned to the active region in the silicon substrate and wherein the exposure of the high-k material to oxygen is minimized.

SUMMARY OF THE INVENTION

The present invention addresses the needs described above by providing a method of fabricating high-k material semiconductor structures in which regrowth of the high-k material is prevented and threshold voltage shifts are minimized. Further, the resulting semiconductor structures comprise high-k material regions that are self-aligned with respect to the active areas in the semiconductor substrate.

According to an embodiment of the present invention, a semiconductor structure is formed by subsequently forming an interface layer on a semiconductor substrate and a high-k material layer on the interface layer. Thereafter, a metallic layer is formed on the high-k material layer, an amorphous silicon layer is formed on the metallic layer, and a silicon nitride layer is formed on the amorphous silicon layer. A shallow trench is developed in the semiconductor structure by photolithography and a trench etch, a trench liner is formed on the trench structure. Next, a shallow trench isolation is deposited in the shallow trench and a shallow trench recess is developed. After that, the silicon nitride layer, the amorphous silicon layer, and the metallic layer are removed and a standard CMOS process flow maybe used.

The resulting semiconductor structure is a self-aligned high-k material semiconductor structure comprising a semiconductor substrate comprising a shallow trench; and a plurality of high-k material layer portions on the semiconductor substrate, wherein an interface layer is located between each portion from among the plurality of high-k material layer portions and the semiconductor substrate; wherein the high-k material layer portions are co-linear with the semiconductor substrate.

BRIEF DESCRIPTION OF THE DRAWINGS

FIGS. 1-13 are sequential vertical cross-sectional views of an exemplary semiconductor structure according to the present invention at various stages of a manufacturing process. FIG. 14 is one embodiment comprising a p-doped and an n-doped region.

DETAILED DESCRIPTION OF THE INVENTION

As stated above, the present invention relates to semiconductor structures having a high-k material portion. Such semiconductor structures are useful in the fabrication of semiconductor devices, for example, in the fabrication of complementary metal-oxide-semiconductor (CMOS). Semiconductor structures and methods of manufacturing the same are now described in detail with accompanying figures. The term "semiconductor structure" is used herein to refer to the semiconductor substrate and any subsequently formed structures on the semiconductor substrate. Thus, semiconductor structure may refer to, for example, to a semiconductor structure before and after a photoresist is applied onto the semiconductor structure.

Figure 1:
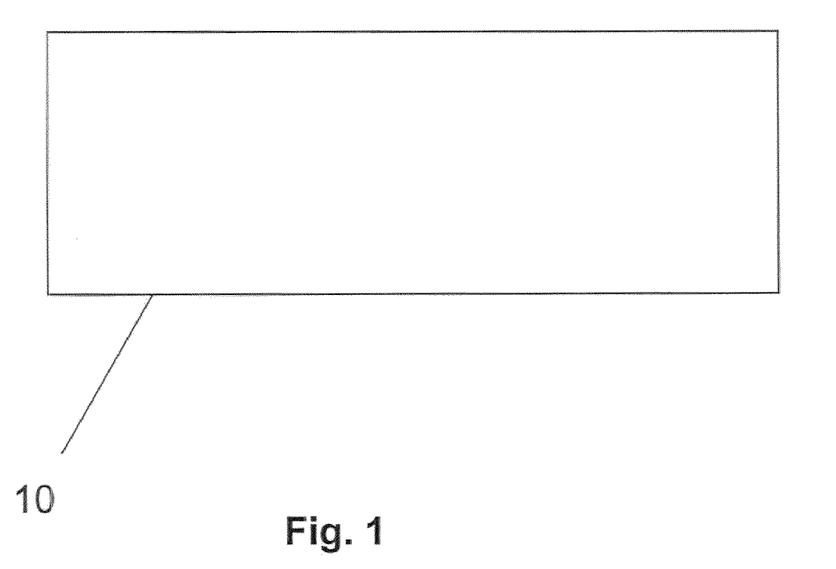
FIG. 1 shows semiconductor substrate 10, typically selected from bulk silicon or from semiconductor-on-insulator (SOI) materials.

Referring to FIG. 1, a semiconductor substrate 10 is provided for fabricating a semiconductor structure. The semiconductor substrate 10 may be any semiconductor material and may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor substrate 10 comprises silicon. Preferably, the semiconductor substrate 10 may be a bulk substrate, a semiconductor-on-insulator (SOI) substrate, or a hybrid substrate. The semiconductor substrate 10 may have a built-in stress. While the present invention is described with a bulk substrate, implementation of the present invention on an SOI substrate or on a hybrid substrate is explicitly contemplated herein. In one embodiment (not shown in the figures) a zero level mask is used to create alignment marks in the substrate. The zero level can be used to align subsequent levels. Well implants are one such level that can be aligned to the zero level alignment marks. As is common in the art of making bulk and partially depleted silicon on insulator CMOS circuits the p well is formed by using a block lithography process and implantation to form the p well. Next the p well block level lithography is removed and n well is formed by forming block level lithography and implanting the n well. The block level lithography can be removed using a solven strip and or plasma $O_2$ ashing process. The wells are typically annealed at high temperatures to activate the dopants and remove damage from the implantation process.

Figure 2:
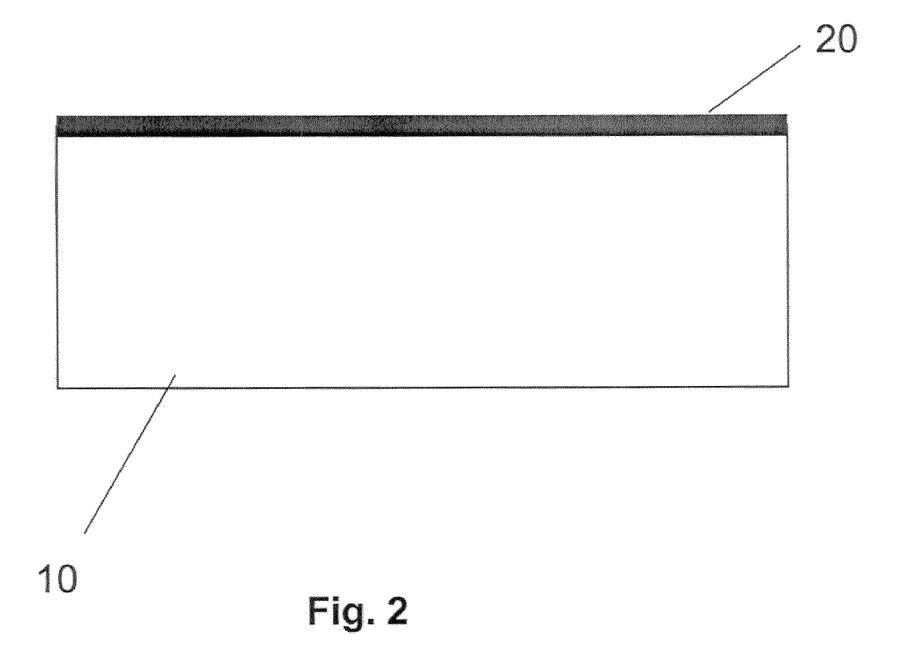
FIG. 2 shows an interface layer 20 formed on the silicon substrate. The interface layer may optionally undergo nitridation treatment.

Referring to FIG. 2, an interface semiconductor oxide layer 20 is formed on the top surfaces of the semiconductor substrate 10. In case the semiconductor substrate 10 comprises silicon, the interface layer 30 comprises silicon oxide. The interface layer 20 may be formed by thermal or chemical oxidation of the semiconductor material in the substrate semiconductor layer 10, or by chemical vapor deposition (CVD). The interface layer 20 may also be formed by surface cleaning techniques known in the art. In a preferred embodiment, the surface cleaning techniques includes a Standard Clean first (SC1) operation using a solution including $NH_4OH/H_2O_2/H_2O$ followed by an optional Standard Clean second (SC2) using a solution including $HCl/H_2O_2/H_2O$ to remove particles, organic impurities, such as hydrocarbon compounds, and metal contaminants and/or particles. The cleaning process removes any native oxide and particles on the semiconductor substrate surface and provides a fresh silicon dioxide surface, i.e., interface layer 20. The thickness of the interface layer 20 is typically from 0.2 nm to about 20 nm, and more typically from about 0.3 nm to about 1 nm.

In a preferred embodiment, a nitride content is added to the interface layer by nitridation. If the interface layer 20 comprises silicon dioxide, at least some silicon dioxide is converted into silicon nitride. Nitridation is performed by methods known in the art, for example, by remote plasma nitridation (RPN) or by deep plasma nitridation (DPN), or $NH_3$ bake process.

Figure 3:
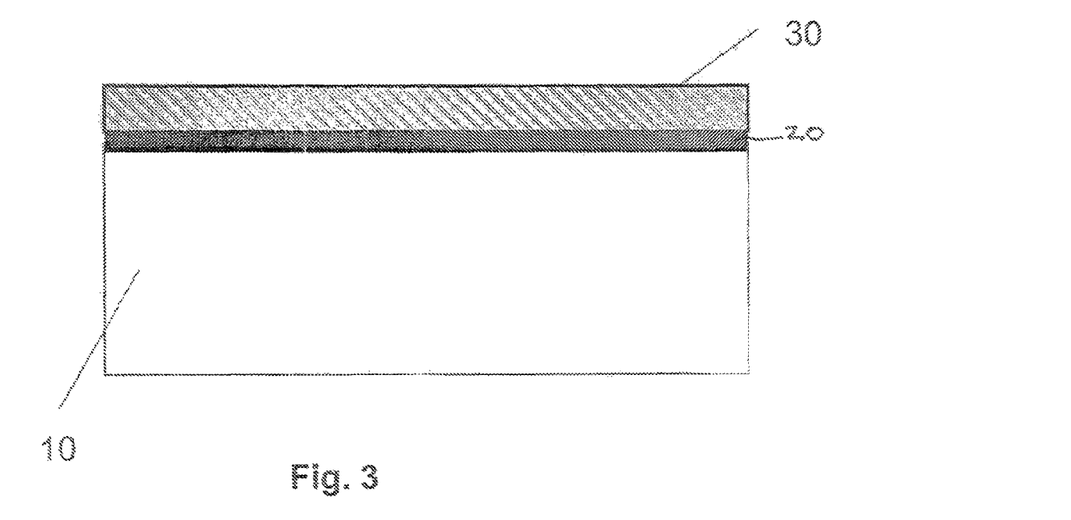
FIG. 3 shows high-k material layer 30 formed on the interface layer 20.

Referring to FIG. 3, a high-k material layer 30 is formed on the interface layer 20. The high dielectric constant (high-k) material layer 30 is formed by methods well known in the art including, for example, a chemical vapor deposition (CVD), an atomic layer deposition (PVD), molecular beam deposition (MBD), pulsed laser deposition (PLD), or liquid source misted chemical deposition (LSMCD). The high-k material layer 30 comprises a dielectric metal oxide having a dielectric constant that is greater than the dielectric constant of silicon nitride of 7.5. Typically, the high-k material layer 30 comprises a dielectric material having a dielectric constant greater than 8.0.

The dielectric metal oxide is a high-k material containing a metal and oxygen, and is known in the art as high-k gate dielectric materials. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Typically, the thickness of the high-k material layer 30 is from about 0.9 nm to about 6 nm, and more typically from about 1.2 nm to about 3 nm. The high-k material layer 30 may have an effective oxide thickness on the order of or less than 1 nm.

In an alternate embodiment (not shown in the figures) capping layers are deposited and patterned over the n and p regions respectively to create appropriate work function shifts for nMOs and pMOS respectively.

Figure 4:
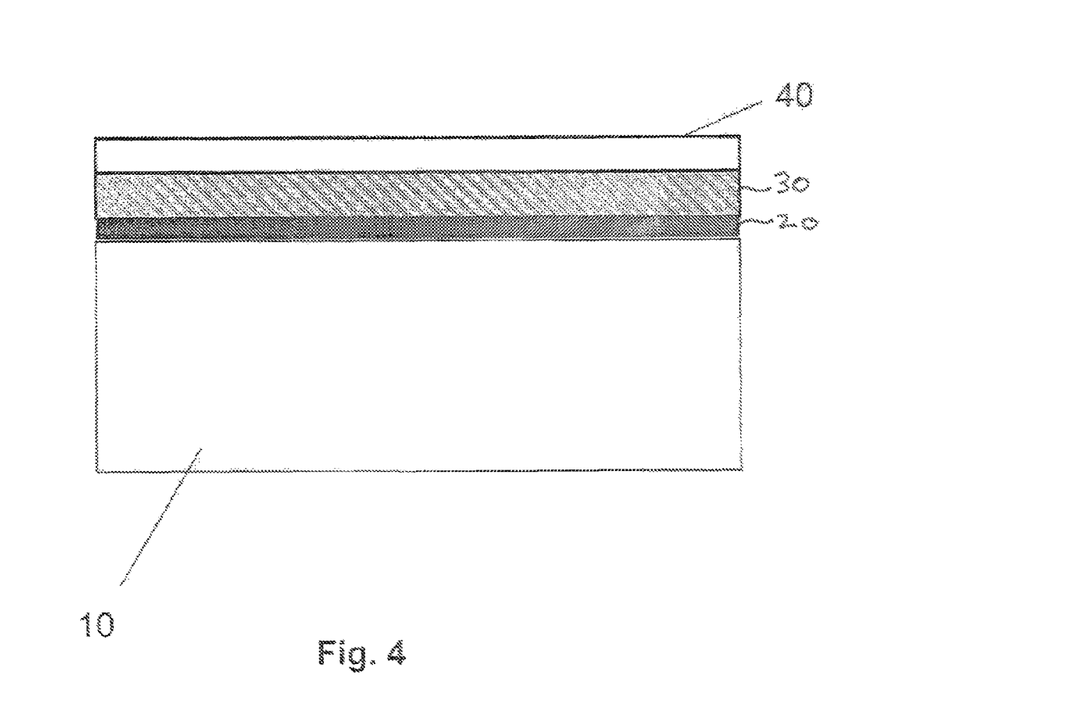
FIG. 4 shows a metallic layer 40 formed on high-k material layer 30.

Referring to FIG. 4, a metallic layer 40 is formed directly on the high-k material layer 30. The metallic layer 40 is formed, for example, by chemical vapor deposition (CVD), physical vapor deposition (PVD), or atomic layer deposition (ALD). The metallic layer 40 may comprise a conductive refractory metal nitride. For example, the metallic layer 40 may comprise a material such as TaN, TiN, WN, TiAlN, TaCN, other conductive refractory metal nitride, or an alloy thereof. The thickness of the metallic layer 40 is typically from about 5 nm to about 40 nm, and more typically from about 7 nm to about 20 nm.

Figure 5:
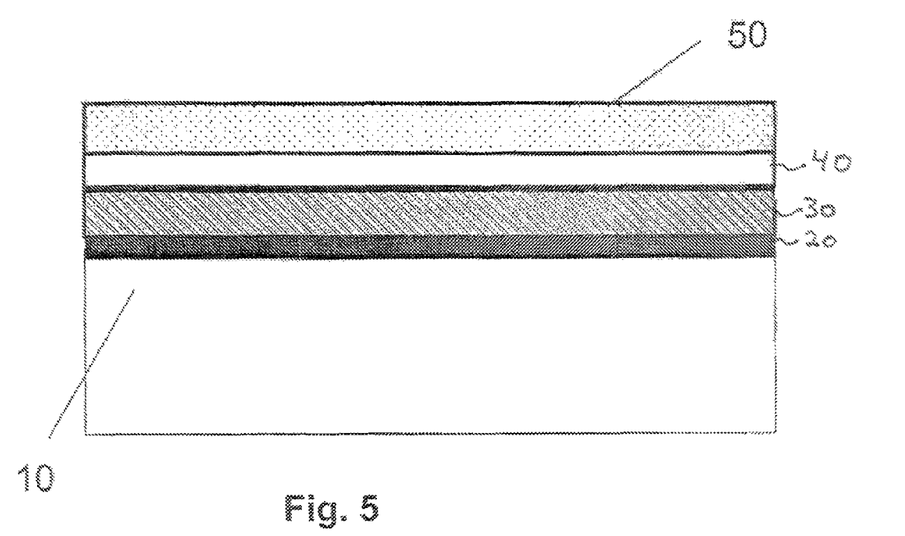
FIG. 5 shows an amorphous silicon layer 50 formed on the metallic layer 40.
Figure 6:
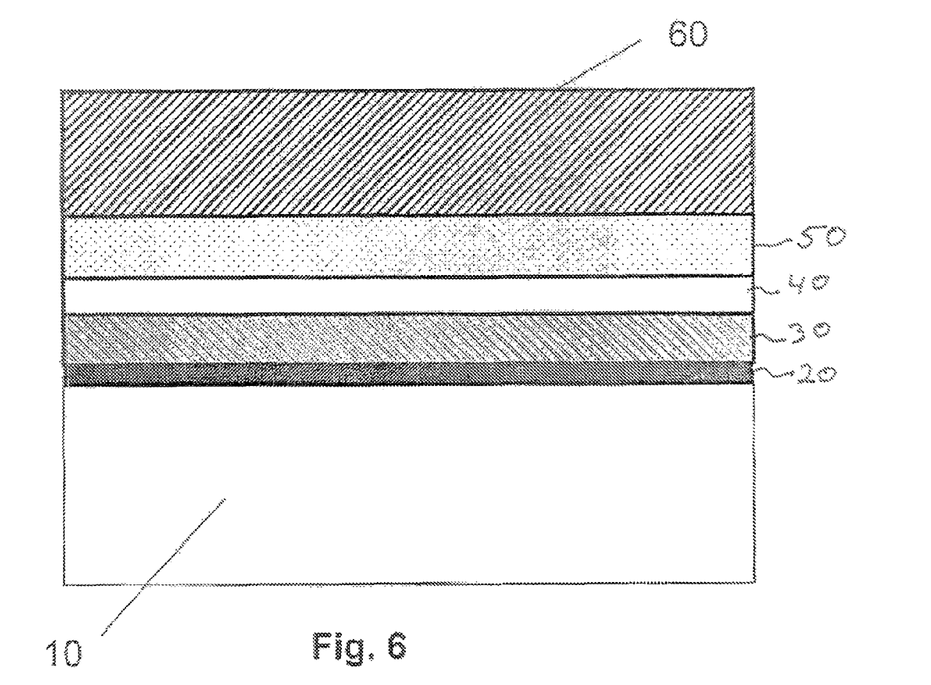
FIG. 6 shows a silicon nitride layer 60 formed on the amorphous silicon layer 50.

Referring to FIGS. 5 and 6, an amorphous silicon layer 50 is formed on the metallic layer 40 and a silicon nitride layer 60 formed on the amorphous silicon layer 50. Amorphous silicon layer 50 and silicon nitride layer 60 serve to protect the underlying high-k material from exposure to oxygen during subsequent processing steps, especially during the formation of the shallow trench insulation. Amorphous silicon layer 50 and silicon nitride layer 60 may be formed subsequently by chemical vapor deposition (CVD) such as LPCVD, RTCVD, or PECVD. The combined thickness of layers 50 and 60 is typically from 5 nm to about 50 nm and is more typically from about 10 nm to about 20 nm, although lesser and greater thicknesses are also explicitly contemplated herein. Layers 50 and 60 function as an chemical mechanical polishing (CMP) stop dielectric layer for a CMP step to be subsequently performed.

Figure 7:
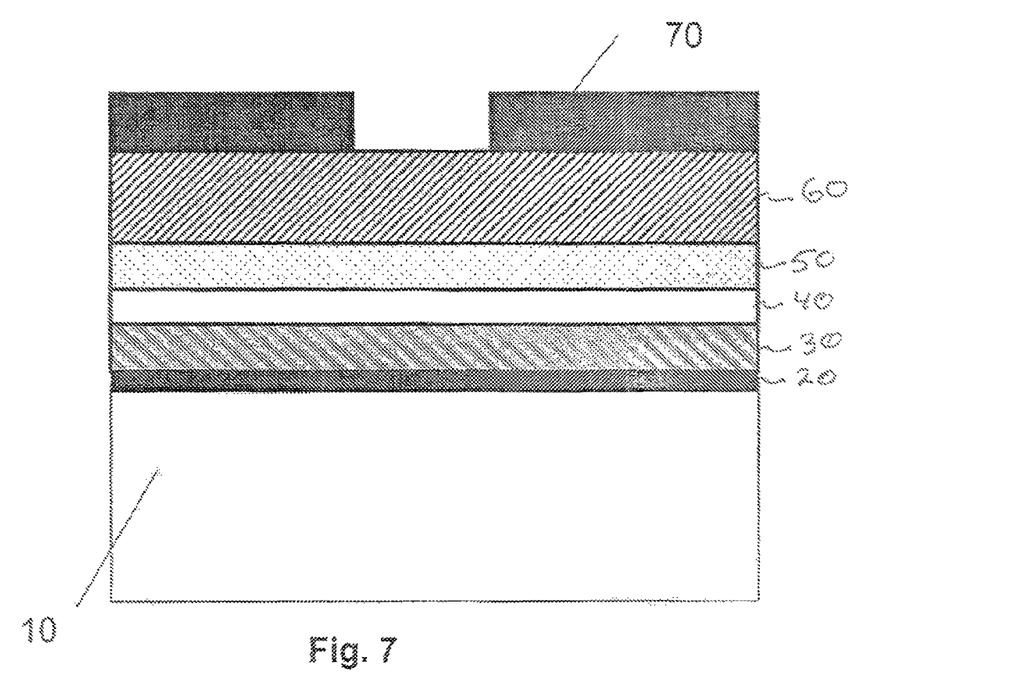
FIG. 7 shows a photoresist pattern 70 imaged on silicon nitride layer 60.

Referring to FIG. 7, a photoresist pattern 70 is imaged in silicon nitride layer 60. The photoresist may be a positive resist or a negative resist. In one embodiment, the shape of the resist remaining on the silicon nitride layer covers doped areas within the semiconductor substrate and exposes areas designated for shallow trenches.

Figure 8:
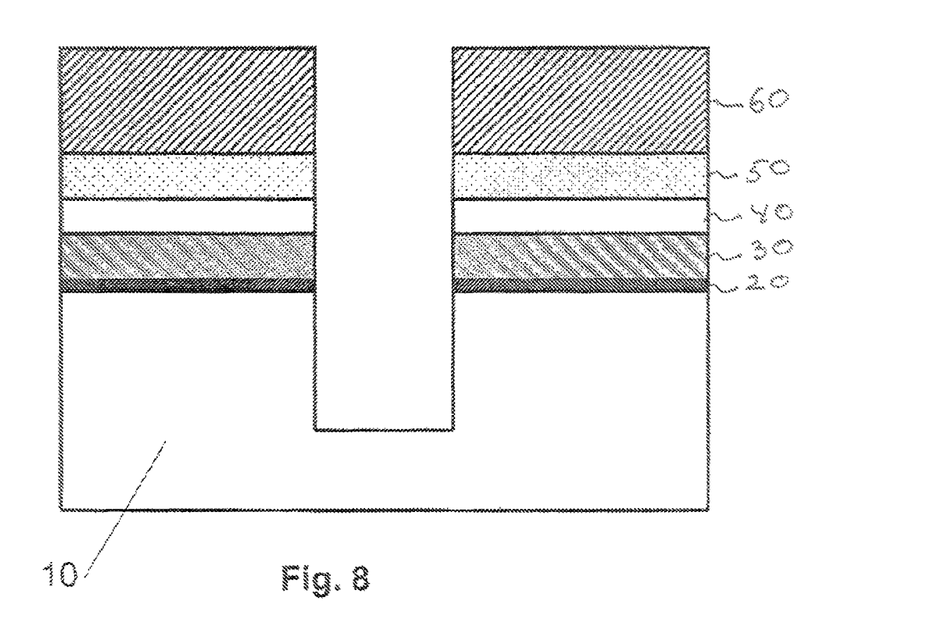
FIG. 8 shows the formation of a shallow trench in the semiconductor substrate by transferring of the resist shape and subsequent removal of the resist.

Referring to FIG. 8, a shallow trench is formed in the semiconductor substrate by transferring the resist shape and subsequent removal of the resist. The exposed portion of the semiconductor substrate layer 10 is removed by an etch, which may be a dry etch or a wet etch. In case the semiconductor substrate 10 comprises silicon conventional dry plasma etch may be employed to remove portions of the semiconductor substrate 10, leaving behind shallow trenches. The photoresist is subsequently removed. In one embodiment, the photoresist is removed by $O_2$-ashing.

Figure 9:
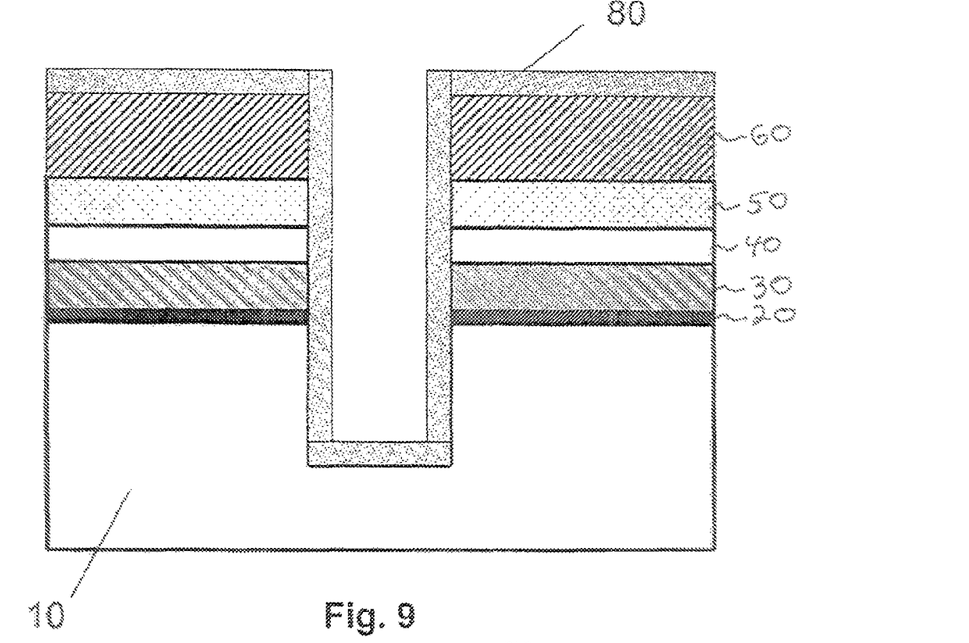
FIG. 9 shows a shallow trench isolation (STI) liner 80 formed on the semiconductor structure covering the silicon nitride layer 60 and the exposed surfaces of the shallow trench.

Referring to FIG. 9, a shallow trench isolation (STI) liner 80 is formed on the semiconductor structure covering the silicon nitride layer 60 and the exposed surfaces of the shallow trench. The silicon nitride layer is deposited to line the sidewalls and bottom of the trench. The liner 80 can be deposited by any of a variety of deposition methods, including CVD, atomic layer deposition (ALD), and sputtering. An additional method of deposition is ion-metal plasma deposition, a sputtering process with magnetic collimation. While silicon nitride deposited by CVD is described here, other materials and deposition processes can be used to form the liner. Stoichiometric silicon nitride ($Si_3N_4$) has a silicon content of approximately 60% by weight, and a nitrogen content of about 40% by weight. Exemplary thickness ranges of liner 80 are between about 200 Å and 1500 Å.

The liner protects the high-k material from contacting the shallow trench isolation material that is deposited next. The semiconductor structure and the method of fabricating the same disclosed herein provide the benefit of protecting the high-k material from exposure to reagents capable of shifting the work function, in particular oxygen while requiring only a single lithography step. The diffusion of oxygen or other gas molecules into the high-k material 30 during subsequent processing steps is prevented by the oxygen-impermeable liner 70, thus keeping the composition of the high-k material portion 30 constant. Particularly, the material of the high-k material portion 30 is not subjected to further oxidation during subsequent processing steps. Thus, the high-k material portion 30, which is the gate dielectric material of a first gate stack structure maintains constant composition.

Figure 10:
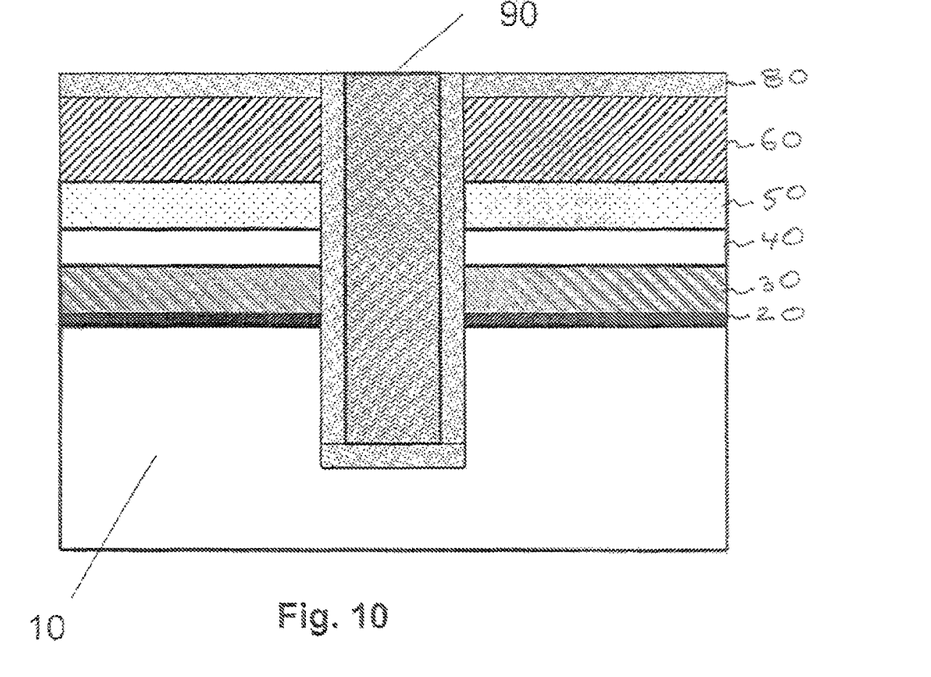
FIG. 10 shows the shallow trench isolation 90 being deposited into the shallow trench and the semiconductor structure being polished by chemical mechanical polishing (CMP).

Referring to FIG. 10, the shallow trench isolation is being deposited into the shallow trench and the semiconductor structure being polished by chemical mechanical polishing (CMP). The shallow trench isolation structure comprises a dielectric material such as silicon oxide or silicon oxynitride, and is formed by methods known in the art. In one embodiment, the shallow trench isolation is formed by high density plasma chemical vapor deposition (HDP CVD) to deposit silicon dioxide in the shallow trenches. The deposition of non-silicon containing isolating materials into the shallow trenches is envisioned. After depositing the shallow trench isolation, a chemical mechanical polishing (CMP) process is performed to remove the shallow trench isolation fill material from the horizontal surfaces of the silicon nitride and leave the shallow trench isolation material in the trenches of the semiconductor structure.

Figure 11:
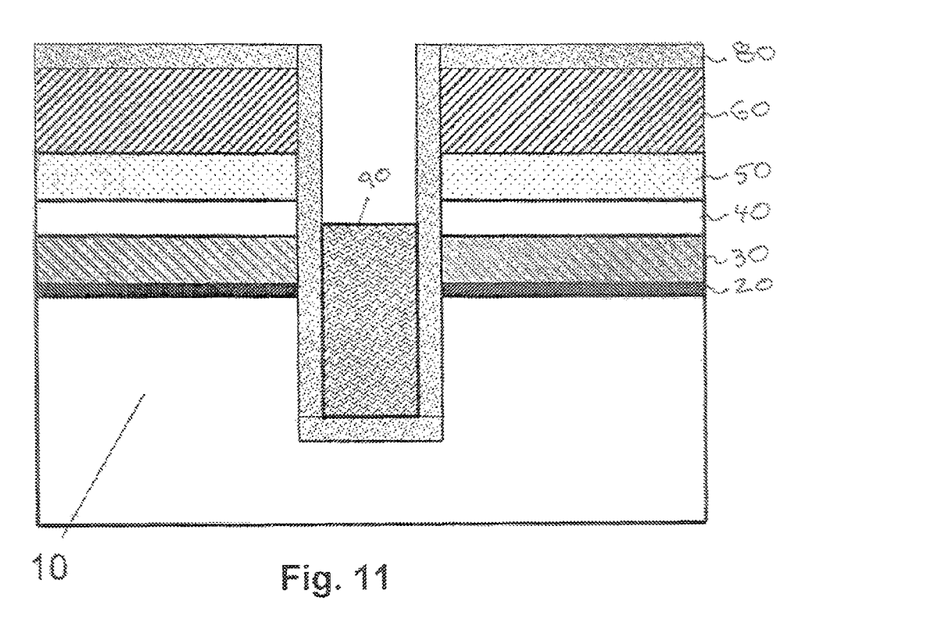
FIG. 11 shows a recess being formed in the shallow trench isolation 90.

Referring to FIG. 11, a recess is being formed in the shallow trench isolation. In one embodiment, the shallow trench isolation recess is formed by a dry etching process known in the art. The recess may also be formed by a wet etching step comprising hydrogen fluoride, HF.

Figure 12:
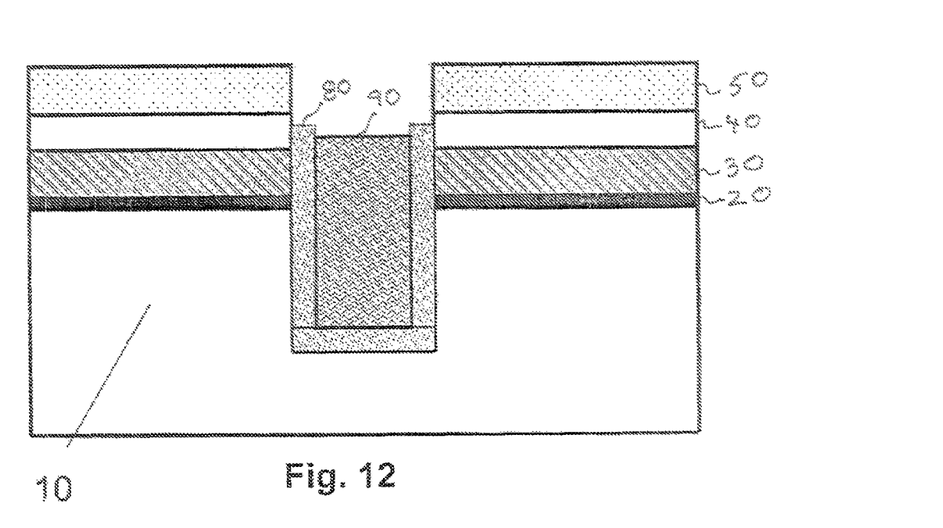
FIG. 12 shows the semiconductor structure wherein the silicon nitride layer 60 has been removed.

Referring to FIG. 12, the silicon nitride layer 60 has been removed from the semiconductor structure. STI liner 70 is partially removed. In one embodiment, the silicon nitride layer is removed by using hot phosphoric acid. An added advantage of using phosphoric acid is the removal of trace quantities of excess HF that is still present in the semiconductor substrate from the formation of the shallow trench isolation recess. The remaining STI liner forms a U-shape and constitutes a continuous barrier for electronically isolating the regions in the semiconductor substrate being adjacent to the shallow trench.

Figure 13:
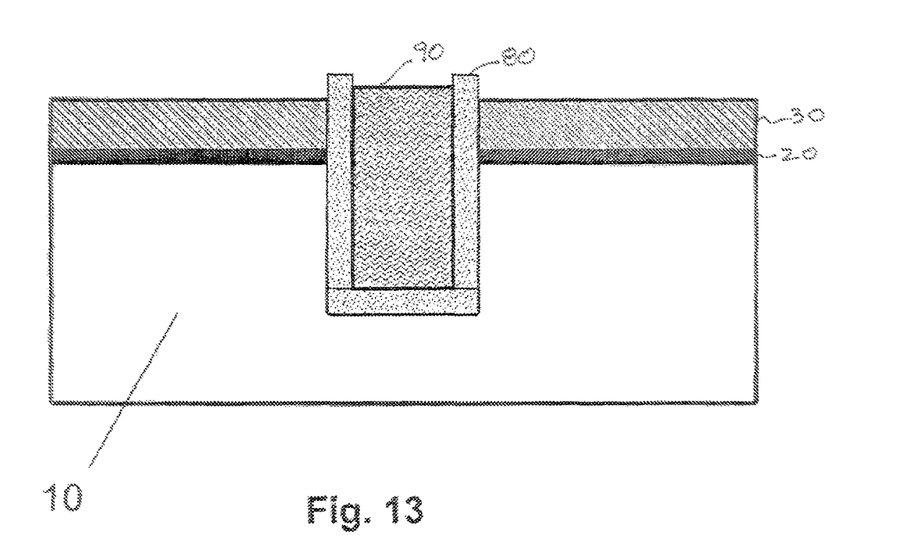
FIG. 13 shows the semiconductor structure wherein the amorphous silicon layer 50 and metallic layer 40 have been removed.

Referring to FIG. 13, the amorphous silicon layer 50 and metallic layer 40 have been removed from the semiconductor structure. The method of removing the metallic layer 40 is depending on the metal or metal alloy used. If the metallic layer comprises TiN, hydrochloric acid is used for removal.

At this point in the inventive process flow a standard gate first process or a standard gate last type process can is used to complete the CMOS circuit processing.

It is noted that the formation of the metallic layer and of the silicon layer is optional, that is that the formation, and thus the subsequent removal of either one or both of the metallic layer and of the silicon layer may be omitted.

Figure 14:
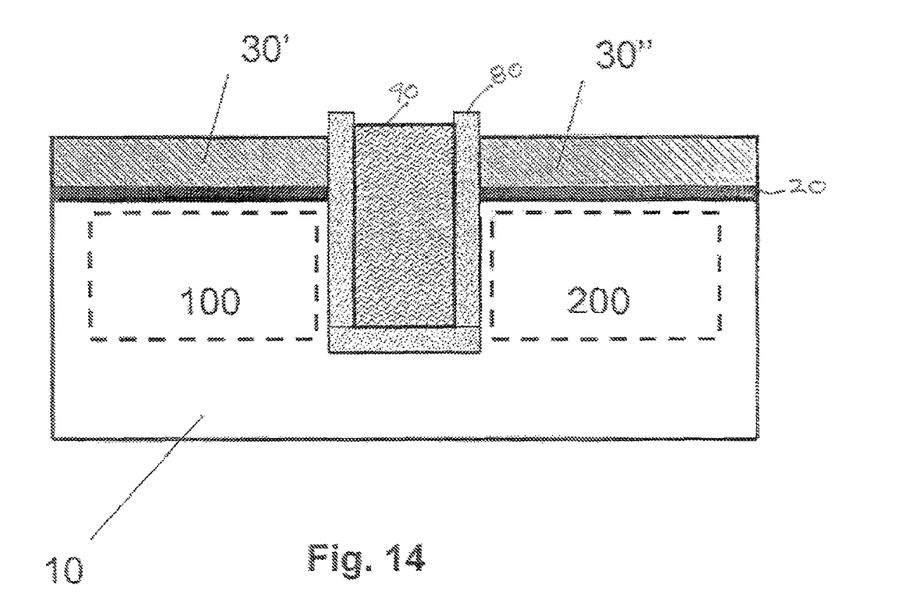
FIG. 14 shows a semiconductor structure having a n-doped region 100 and a p-doped region 200 adjacent to respective high-k material portions 30' and 30".

Referring to FIG. 14, a semiconductor structure having an n-doped active region 100 and a p-doped active region 200 are shown to which high-k material portions are aligned. The exemplary semiconductor structure of FIG. 14 comprises an n-type field effect transistor (NFET) region 100, in which an n-type metal oxide semiconductor field effect transistor (NMOSFET) is to be formed, and a p-type field effect transistor (PFET) region 200, in which a p-type metal oxide semiconductor field effect transistor (PMOSFET) is to be formed. Each of the NFET region 100 and the PFET region 200 comprises a non-overlapping portion of semiconductor substrate 10. The portion of the semiconductor substrate 10 in the NFET region 100 is electrically isolated from the portion of the semiconductor substrate 10 in the PFET region 200 above the bottom surface of the shallow trench by the shallow trench isolation structure. In some circuits, selected devices are isolated using butted junctions, that is, the n type doping is directly adjacent to the p type doping and the junction is used to form isolation, or in some instances the junction is used to form a diode.

The high-k material portions 30' and 30" indicated in FIG. 14 are self-aligned with respect to the active regions 100 and 200, respectively, in the semiconductor substrate by virtue of the high-k material being deposited prior to the photolithography and etching steps discussed above referring to FIGS. 7 and 8. By contrast, in the conventional method in which the high-k material is deposited after the formation of the shallow trenches, another photolithography and etch step is used to pattern the gate electrode. In the conventional approach, the high k gate dielectric, is not self aligned to the active region and is in contact with the shallow trench isolation material which can cause the gate stack to have re growth and work function shift.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

All publications, patents and patent applications cited in this specification are herein incorporated by reference, and for any and all purpose, as if each individual publication, patent or patent application were specifically and individually indicated to be incorporated by reference. In the case of inconsistencies, the present disclosure will prevail.

The foregoing description of the disclosure illustrates and describes the present disclosure. Additionally, the disclosure shows and describes only the preferred embodiments but, as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The embodiments described hereinabove are further intended to explain best modes known of practicing it and to enable others skilled in the art to utilize the disclosure in such, or other, embodiments and with the various modifications required by the particular applications or uses. Accordingly, the description is not intended to limit it to the form disclosed herein. Also, it is intended that the appended claims be construed to include alternative embodiments.

What is claimed is:

1. A method of forming a semiconductor structure comprising: forming an interface layer on a semiconductor substrate; forming a high-k material layer on the interface layer; forming a silicon nitride layer on the high-k material layer; developing a shallow trench in the semiconductor structure by photolithography and etching or pattern transfer; forming a trench liner on the semiconductor structure; depositing a shallow trench isolation; removing the silicon nitride layer; and further comprising forming a metallic layer on the high-k material layer and forming the silicon nitride layer on the metallic layer instead of the high-k material layer,
wherein the metallic layer is removed concurrently with, or subsequent to, the removing of the silicon nitride layer.

2. The method of claim 1, further comprising converting the interface layer into a nitride containing layer.

3. The method of claim 1, further comprising forming a silicon layer on the metallic layer and forming the silicon nitride layer on the silicon layer instead of the metallic layer,
wherein the silicon layer is one of an amorphous silicon layer and a polycrystalline silicon layer, and
wherein the silicon layer is removed concurrently with, or subsequent to, the removing of the silicon nitride layer.

4. The method of claim 1, wherein the semiconductor substrate is a doped semiconductor material.

5. The method of claim 1, wherein the trench liner is oxygen-impermeable.

6. The method of claim 1, wherein the trench liner is U-shaped.

7. The method of claim 1, wherein the silicon nitride layer is removed by treatment with hot phosphoric acid.

8. The method of claim 1, wherein the shallow trench recess is developed by dry etching.

9. The method of claim 1, wherein the semiconductor structure is planarized by a chemical mechanical polishing prior to the developing of the trench isolation recess.

10. The method of claim 1, wherein the trench liner is deposited by atomic layer deposition (ALD).

* * * * *